United States Patent [19]

Landi

[11] Patent Number: 4,944,087
[45] Date of Patent: Jul. 31, 1990

[54] METHOD OF MAKING A CURVED PLASTIC BODY WITH CIRCUIT PATTERN

[75] Inventor: Vincent R. Landi, Danielson, Conn.

[73] Assignee: Rogers Corporation, Rogers, Conn.

[21] Appl. No.: 253,974

[22] Filed: Oct. 5, 1988

[51] Int. Cl.$^5$ ............................................. H05K 3/12
[52] U.S. Cl. ....................................... 29/848; 29/846; 174/255
[58] Field of Search ................... 29/846, 848, 849; 474/68.5, 225; 428/901; 343/700 MS File

[56] References Cited

U.S. PATENT DOCUMENTS

| | | | |
|---|---|---|---|
| 3,230,163 | 1/1966 | Dreyfus | 174/68.5 X |
| 3,649,394 | 3/1972 | Erickson, Jr. | 174/68.5 X |
| 4,584,767 | 4/1986 | Gregory | 29/846 X |
| 4,651,417 | 3/1987 | Schumacher, III et al. | 29/898 |

FOREIGN PATENT DOCUMENTS

| | | | |
|---|---|---|---|
| 2920091 | 11/1980 | Fed. Rep. of Germany | 174/259 |
| 2131232 | 6/1984 | United Kingdom | 343/700 MS |

OTHER PUBLICATIONS

IBM Tech Discl Bull vol. 2, No. 1, Jun. 1959 by Haddad et al p. 9.
IBM Tech Discl Bull vol. 4, No. 3, Aug. 1961 by Radovsky pp. 30-31.
IBM Tech Discl Bull vol. 8, No. 8, Jan. 1966 by Webb et al pp. 1025-1026.
IBM Tech Discl bull vol. 9, No. 11, Apr. 1967 by Kollmeier et al pp. 1520-1521.

*Primary Examiner*—Carl E. Hall
*Assistant Examiner*—Carl J. Arbes
*Attorney, Agent, or Firm*—Fishman, Dionne & Cantor

[57] ABSTRACT

A highly accurate circuit pattern in intimate contiguous relationship with a curved plastic body and a method of manufacture thereof. In accordance with the present invention, circuit pattern is detachably fixed to a flexible substrate and is placed into a mold. A molding compound is then forced into the mold pressing the circuit against the mold wall and filling all of the mold voids. The molded product is thereafter removed from the mold. The flexible substrate, on which the metallic circuit is printed, is removed from the molded product leaving the metallic circuit imbedded into the molded product.

17 Claims, 3 Drawing Sheets

METHOD OF MAKING A CURVED PLASTIC BODY WITH CIRCUIT PATTERN

BACKGROUND OF THE INVENTION

This invention relates to an electronic circuit embedded into the surface of a three-dimensional molded object and a method for making the same. More particularly, the present invention relates to a plane conformable precise metallic pattern, such as an electronic circuit, in intimate contiguous relationship with a three-dimensional hard plastic object and a method for making the same.

Circuit elements, such as microwave antennas, are often desired to be placed on curved, three dimensional plastic surfaces. To meet this need, the circuit element has to be curved to conform with the curvature of the surface. An example of curved circuitry is a patch or spiral microwave antenna described in U.S. Pat. Nos. 4,051,480 and 4,010,470 to Jones. These patents demonstrate the utility of conformal antennas.

Microwave antenna circuit elements must also have high accuracy, (on the order of a fraction of several thousandths of an inch), for the circuit to function properly. However, it is difficult and expensive to form highly accurate metallic patterns or circuit elements on a curved surface compared to forming similar circuits on a flat surface. This difficulty and expense limits the use of curved circuit elements regardless of their advantages.

What applies to microwave circuit elements applies more broadly to other high speed signal transmission such as high frequency analog or short pulse signals used increasingly in digital and telecommunication applications. In these cases, as in microwave applications, great demands are put on electrical impedance contributions of the dielectric supports of circuit traces and fine accurate dimensions of the conductive traces themselves. It is also increasingly understood that special advantages accrue to curved 3-dimensional circuitry in such applications, since improved use of space, economies of production and shorter distances for signal propagation become possible.

In recent years, several new approaches have been taken to attach conductive Patterns onto curved plastic surfaces. In one approach, an already molded part having a plane conformable surface is pressed against a carrying sheet. The carrying sheet has a circuit pattern on its surface which is comprised of conductive particles in a resinous matrix, on its surface. Upon application of heat, the resin adheres to the rigid plastic substrate, and the conductive particles settle out to a more densely packed condition of enhanced conductivity. The resin is typically a thermoset which conforms to the curved surface of the molded article. Heating of the resin fixes the conductive particles to the substrate and thus defines the location of the pattern. Unfortunately, this method is deficient for microwave applications. The random nature of the aggregated particles create surface irregularities which can cause unwanted radiations of electromagnetic energy. Also, these conductors have a high resistivity which is unacceptable for use in a microwave or other high speed circuit. This method also requires a separate positioning and heating step in addition to a molding step for placement of the circuit onto the substrate which is inefficient and costly.

Another approach to producing three-dimensional metallic patterns on a plastic substrate makes use of a patterned mold cavity. In this method the circuit pattern exists as an electrically conductive region of the mold while the remainder of the mold is non conductive. Metallic copper is plated onto the conductive region. The copper adheres to the conductive regions of the mold, but does not adhere to the other regions of the mold. Excess copper is removed and plastic is forced into the mold. Steel or a similar metal is preferably used as the mold material, so that the copper adheres to the plastic during the molding step. This effects a transfer of the pattern to the plastic from the metal wall when the steel mold is removed. However, this prior art method also suffers from certain known problems. For example, this approach is inherently very expensive. It requires replating the mold with the copper pattern between each molding step, which is time consuming, or using preplated mold inserts, which entails expensive machining for each insert to achieve the high precision required. Also, many desirable molding compounds contain abrasive fillers which eventually degrade the pattern definition, resulting in poor quality and eventual replacement of the mold or inserts. Also, use of a distinct circuit pattern will require new inserts or a new mold thereby further increasing expense.

Yet another prior art approach involves molding in raised relief the desired circuit pattern using an easily electroplated filled plastic. Then, in a second molding step, non-plating plastic is molded in the depressed region of the original molded surface. Unfortunately, this method requires specially filled plastics in which the fillers are inimical to the needs of low dissipation factor and well controlled dielectric constant which are necessary properties for microwave and other high speed circuits substrates. In addition, relying on molding thin lines of conductor or material (later plated to be conductive) is not a reliable method for holding tight tolerances on narrow lines of critically controlled impedance.

SUMMARY OF THE INVENTION

The above-discussed and other problems and deficiencies of the prior art are overcome or alleviated by the dimensionally accurate circuit pattern molded curved body of the present invention and its method of manufacture.

In accordance with the present invention, accurately produced circuitry on a flexible circuit substrate is transferred to a curved three-dimensional plastic body by molding the plastic in a predetermined shape against the flexible circuit and then, after removing the molded assembly from the mold; removing the flexible substrate thus leaving the metallic pattern adhered to and accurately positioned on the plane conformable curved surface of the hard molded plastic body.

Accurate circuitry is produced using standard photolithographic methods for producing a continuous copper or other metallic trace from a smooth copper foil detachably laminated to a flexible substrate. The flexible substrate must be able to withstand the high molding temperatures of the plastic. The adhesive used to adhere the copper to the substrate must also be able to withstand the high mold temperatures and pressures. The photolithographic technique allows many circuit patterns to be simultaneously produced on a single sheet of material. The circuits are then automatically cut to size for use in the molding process. A flexible circuit (which has been cut to size), is then inserted into the mold. The exposed surface of the copper or other metal attached to the flexible substrate is suitably treated to enhance the adhesive bond between the copper and the molding compound. The exposed and treated side of the copper, which defines the circuit, faces the inside of the mold cavity. The flexible circuit is held in place by vacuum, pins, or any other suitable means. These hold down means prevent slippage of the flexible circuit which provides the accurate placement required on the final molded product.

With the flexible circuit in place, plastic molding material is forced into the cavity and pressed against the exposed copper surfaces. Sufficient pressure is employed to insure good contact between the plastic and the copper and to pack the molding compound into a defect free molded part. The molded part is removed from the mold after the molding compound has become solid. The flexible substrate and adhesive is removed from the molded part by employing a special treatment suitable to the molding compound, adhesive and flexible substrate. What is left is a highly accurate circuit on a curved plastic body.

If the molding compound is a thermoplastic, the adhesive is chosen such that with specific solvents or chemically active solutions, the adhesive can be dissolved but the thermoplastic can not. Heat alone cannot be used to soften the adhesive since the thermoplastic molding compound must soften below the softening temperature of the adhesive for a successful molding step. For example, if isotactic polypropylene were used as the molding compound, LARC TPI could be used as the adhesive and alcoholic potassium hydroxide solutions used to dissolve the adhesive.

If the molding compound is a suitable thermoset, either dissolving adhesive with solutions that attack the adhesive and not the molding compound; or softening the cured thermoset adhesive by heat may be used. It should be recognized that in either case a sufficient degree of cure may be developed during the molding step, or during a subsequent postcure operation.

It will be appreciated that because the circuitry is photolithographed onto a flexible substrate, a number of circuit patterns can be utilized without changing the mold. Also, expensive tooling is not required, no pattern wear results, and only a single molding step is necessary. These advantages result in flexibility, improved quality, higher efficiency, and lower cost compared to the prior art. This method also results in a highly accurate circuit pattern.

The above-discussed and other features and advantages of the present invention will be apparent to and understood by those of ordinary skill in the art from the following detailed description and drawings.

BRIEF DESCRIPTION OF THE DRAWINGS

Referring now to the drawings wherein like elements are numbered alike in the several FIGURES.

DESCRIPTION OF THE INVENTION

Referring simultaneously to FIGS. 1-5 a curved, 3-dimensional plastic body with a highly accurate metallic pattern imbedded on its surface is shown generally at 10. The curved body/metallic pattern 10 is comprised of a 3-dimensional plastic body 12, which in the preferred embodiment is the shape of a cone, cylinder or other plane conformable surface (by "plane conformable" it is meant a surface on which a flexible plane may be made to conform without distorting the plane by creasing, crimping and stretching) and a highly accurate metallic pattern 14, which in the preferred embodiment is a highly accurate copper circuit.

Figure 5:
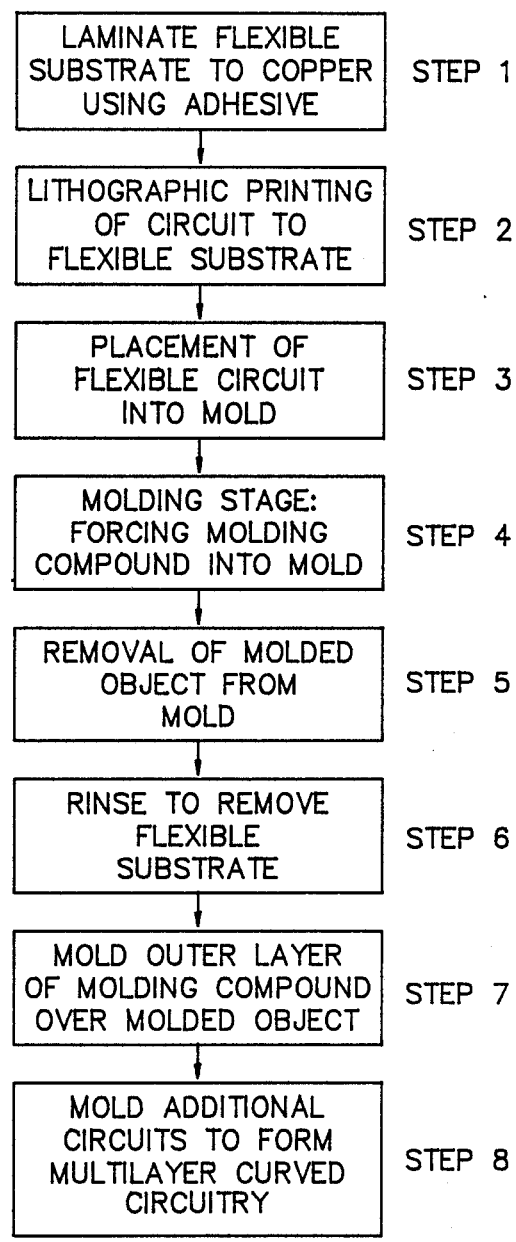
FIG. 5 is a process flow chart of the present invention.

The curved body/metallic pattern 10 is manufactured by a process schematically shown in FIG. 5. Step 1 is to prepare a laminate of the flexible substrate to copper using appropriate adhesive. It is preferred to use treated copper with the treated side exposed after lamination. This is to maximize adhesion of the copper to the molding compound. Adhesion of the copper to the flexible circuit needs only to be sufficient to survive the molding step, and copper facing the adhesive may or may not be treated. Copper treatments frequently used in preparing printed circuit boards are appropriate, such as electrodeposited copper types which provide a dendritic structure on treated sides which provide mechanical interlocking when laminated with polymers. It may also be desirable to treat the exposed copper with adhesion enhancers appropriate to the molding compound used. Step two of the process involves the formation of a highly accurate metallic pattern 14 on a flexible substrate 16 to create a flexible circuit 18. Step three of the process involves the placement of flexible circuit 18 into a mold 20 which is dimensioned in the pre-selected shape of a desired 3-dimensional plastic body 12. Step four of the process involves forcing a molding compound 22 into mold 20, to fill mold 20, compound 22 is then cured to thereby form a molded object 24. Step five of the process involves removal of molded object 24, which is the curved body/metallic pattern 10 with flexible substrate 16 attached. Molded object 24 is then post baked to increase the degree of cure in thermosets and to remove internal stresses in both thermosets and thermoplastics. Step six of the process involves rinsing molded object 24 to remove flexible substrate 16 which results in the finished product, that is a 3-dimensional plastic curved body with a highly accurate metallic pattern imbedded into its surface.

As mentioned, flexible circuit 18 is placed into a mold cavity 28 found within mold 20. A relief 30 set into cavity wall 32 is dimensioned to hold flexible circuit 18. A vacuum port 34 located in relief 30 draws flexible circuit 18 into relief 30 and holds flexible circuit in place while the molding (step four) process occurs. Retractable pins may also be used to hold flexible circuit 18 in place.

Molding compound 22 is forced into mold cavity 28 and pressed against metallic pattern 14 and to pack compound 22 into cavity 28. Sufficient packing pressure will help to insure a defect free molded part.

As mentioned, removal of molded object 24 with metallic pattern 18, and flexible substrate 16 is followed by appropriate post baking of molded object 24 to finish curing molding compound 22 and relieve well known molded-in stresses. This step is followed by an operation to remove substrate 16 and adhesive 26 from molded object 24 without removing metallic pattern 14 from plastic, and without damaging molded object 24. A solvent rinse is preferred. This solvent or solution will dissolve or decompose adhesive 26 while having no effect on the cured plastic or metallic pattern of which finished product 10 is comprised. Heat (when thermoset molding compounds are used), or other means may also be used to remove adhesive 26 and flexible substrate 16.

Flexible circuit 18, which includes highly accurate metallic pattern 14 adhered to flexible substrate 16, is preferably produced using a well known photolithographic technique on copper clad film. The copper clad film is a solid layer of copper, adhered by an adhesive 26 to a flexible film, or substrate 16.

Film 16 and adhesive 26 should be materials which withstand the heat of molding and are removable from the molded article subsequent to molding. The preferred film is a polyimide film such as well known KAPTON film. Such polyimide films are dimensionally stable at temperatures above the molding temperature, in conjunction with a proper adhesive, these films are easily removed from the molding compound. Mylar or other films of high dimensional stability may also be used.

The adhesive can be LARC thermoplastic polyimide, other polyimides, epoxy, phenolic and other thermoset resins which may be later removed from the molded plastic by a chemical agent, solvent or high temperature. The solvents, agents, or temperature must be compatible with the molding material so as not to damage the molding material upon removal of the adhesive and film.

Molding compound 22 must have suitable dielectric properties for microwave application or other high speed signal transmission. In addition to having acceptably low dissipation factors at microwave frequency, the molding materials must have dielectric constants suitable to the design of the microwave or other high speed signal transmission component. The materials must be able to withstand the high temperatures and other rigors of processing of the printed wiring board which include soldering connections. They must exhibit stable dielectric constants and dissipation factors with respect to temperature variations and moisture exposure, so that the fine control of impedance, resonant frequency or other permittivity connected characteristics is maintained. The materials must be dimensionally stable. They must be strong enough to withstand end use mechanical loads, such as high accelerations when used in projectiles. Finally, the materials must be moldable, preferably by high volume low cost techniques.

A preferred molding compound which satisfies the above requirements is the highly cross-linked vinylbutadiene disclosed in U.S. Pat. application Ser. No. 050,243 filed May 14, 1987 (assigned to the assignee hereof). The material of USSN 050,243 is sold commercially by Rogers Corporation under the trademark TMM. Other molding compounds include suitably filled thermosetting plastic compounds such as epoxies, diallyl phthalates, polyimides, polyesters and alkyds, and silicones, and in less demanding cases phenolics, ureas, and melamines. Also unfilled high temperature thermoplastics and their filled compounds may sometimes be used including PEEK, PPS, PEI, polysulfone polyesters, polyacrylates and polyamide imide crystalline polyolefins. It will be appreciated that this list of thermosetting and thermoplastic materials is by example only.

Fillers incorporated in the plastic molding compound can include those added to achieve specific dielectric constants, low coefficient of thermal expansion, strength and modulus (all of which are consistent with the overall needs for a microwave substrate). Preferred fillers include, but are not limited to silica, titanium dioxide, various metallic titanates, alumina, magnesia, boron nitride, silicon carbide, aluminum nitride, ground quartz, microglass, kevlar and other fibers consistent with microwave applications.

An important feature of the present invention results from the relationship of the polymeric materials used as substrate (I), flexible carrier (II), and the adhesive (III) between flexible carrier and thin metallic circuit traces. Greater flexibility in choice of II and III is allowed by the preferred substrate, which is Rogers Corporation's TMM molding material.

The adhesive used must not soften at the temperature of molding since this will allow movement of the fine metallic traces, but still it must be removable after molding without damaging the substrate polymer. Such damage of I when removing III, for instance, could occur if a temperature exceeding the melt or softening (e.g. glass transition) temperature of I were required to remove III. Or else, if a chemical agent were used to remove III, said chemical agent can not also attack I.

In a preferred embodiment, a thermosetting TMM molding compound I is used which cures around 340° F. The adhesive III is LARC thermoplastic polyimide which has a glass transition temperature higher than this temperature and so does not yield under the pressure of molding. Then, the molded part is postbaked which further cures the thermosetting resin to a very highly crosslinked degree. Next, a hot concentrated alkali (caustic) solution is used to chemically attack the LARC adhesive but which cannot attack the highly crosslinked hydrocarbon thermoset material I. However, the preferred TMM thermosetting compound is an unusual plastic material. It will be appreciated that crosslinked epoxy or crosslinked polyimide and most high temperature thermoplastics would not withstand the exposure to hot caustic solution.

With the preferred system, one may actually be able to remove the flexible substrate by heating above the LARC glass transition temperature and peeling. Most thermosetting plastic molding materials would not be capable of this.

Figure 1:
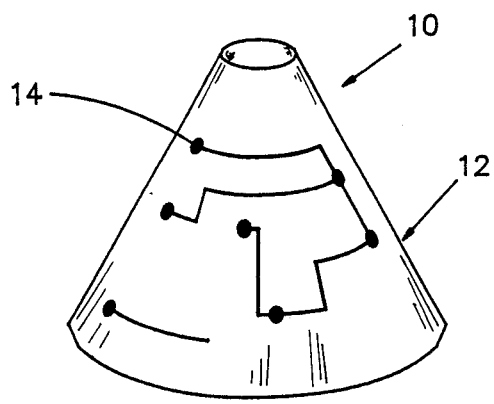
FIG. 1 is a front perspective view of a three dimensional object with a highly accurate circuit pattern imbedded on its surface in accordance with the present invention.
Figure 2:
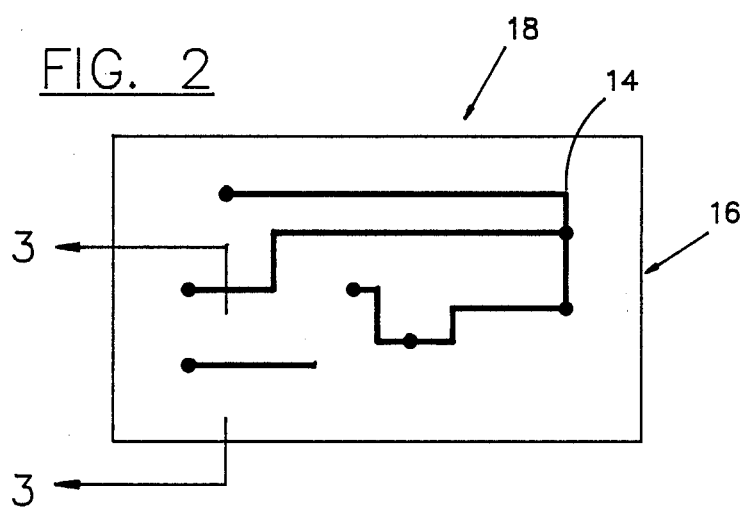
FIG. 2 is a top elevation view of a highly accurate circuit on a flexible substrate.
Figure 3:
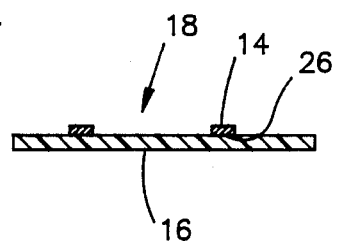
FIG. 3 is a cross-section elevation view along the line 3—3 of FIG. 2.
Figure 4:
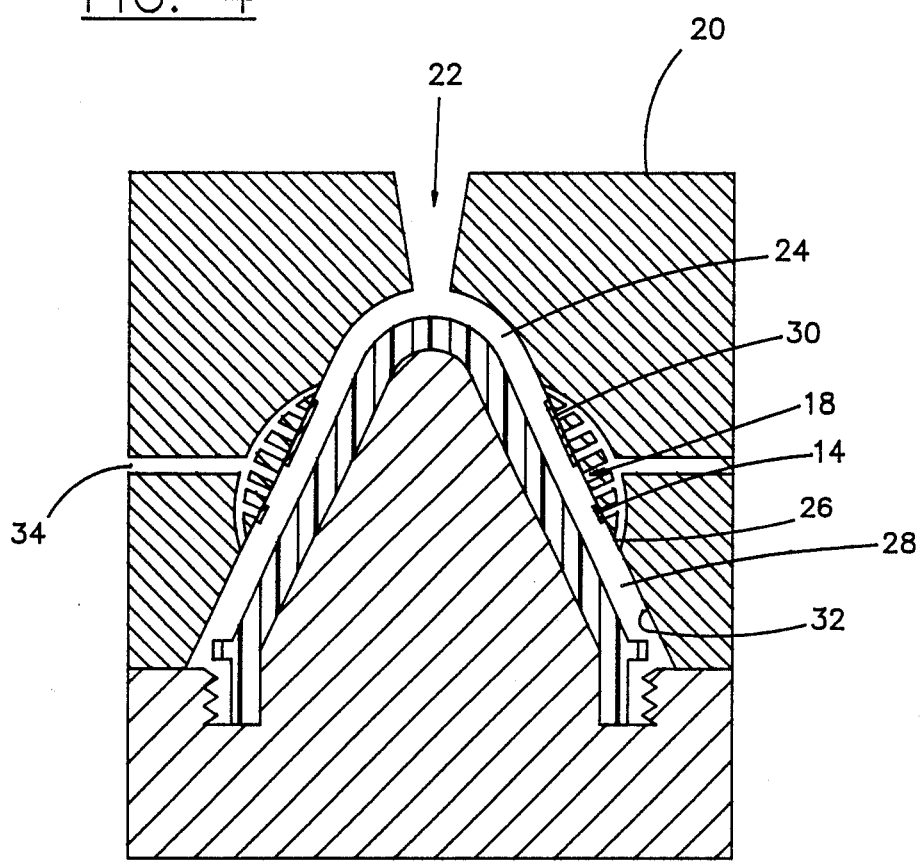
FIG. 4 is a cross-sectional view of a three dimensional mold with a circuit on a flexible substrate positioned within the mold cavity in accordance with the present invention.

In addition to the curved three dimensional object depicted in FIG. 1, it will be appreciated that the present invention contemplates the manufacture of substantially more complex shapes. For example, multilayer curved circuitry may be made using previously produced circuit inserts in subsequent molding steps. In this way, integral conical antenna radomes wherein the circuit is encapsulated within the structure may be easily produced. In this latter embodiment, the additional method of adding at least one additional layer of molding compound to encapsulate the circuit and provide a protective covering is utilized (see steps 7 and 8 in FIG. 5). It will be appreciated that the additional circuit may be indexed to the previously molded circuits.

The method of manufacturing a flexible highly accurate circuit on a curved plastic body in accordance with the present invention offers many advantages to the manufacturer and subsequent user. Using a flexible circuit insert allows many circuit patterns to be used with a single mold. There is little wear with this process which results in a high quality product and reduced expense. The photolithographic technique used to define the circuitry is highly accurate, which results in high resolution circuitry necessary for microwave applications. Another benefit of this process is the one step molding which increases manufacturing speeds and efficiencies. The circuit insert allows many circuit patterns to be used with a single mold. This method of producing highly accurate circuitry on a curved body results in low cost, improved quality, and efficient manufacturing.

While preferred embodiments have been shown and described various modifications and substitutions may be made thereto without departing from the spirit and scope of the invention. Accordingly, it is to be understood that the present invention has been described by way of illustrations and not limitations.

What is claimed is:

1. A method of making an article having a circuit pattern embedded on a surface of the article comprising:
    forming a metallic circuit pattern on a flexible substrate to define a flexible circuit, wherein the circuit pattern is bonded to the substrate by an adhesive layer between the circuit pattern and the substrate;
    placing said flexible circuit into a mold cavity with the circuit pattern facing toward the interior of the mod cavity;
    introducing a molding compound into said mold cavity to fill the mold cavity, wherein said molding compound is forced against said flexible circuit;
    curing said molding compound to define an article;
    removing said article from the mold cavity with said flexible circuit embedded on the surface of the article; and
    removing the adhesive layer to release said flexible substrate from said article while leaving said circuit pattern embedded on the surface of the article 2. The method of claim 1, wherein the adhesive is removed by dissolving the adhesive layer with a solvent.

3. The method of claim 1, wherein the adhesive is removed by chemically decomposing the adhesive layer.

4. The method of claim 1, wherein the molding compound comprises a thermosetting polymer and the adhesive layer is removed by thermally decomposing the adhesive layer.

5. The method of claim 1 wherein said molding compound is selected from the group consisting of epoxies, diallylphthalates, polyimides, thermoset polyesters, vinyl esters, alkyds, silicones, phenolics, ureas, melamines, polysulfones, polyester, polyacrylates, polyamide imides, PEEK, PPS, crystalline polyolefins and PEI.

6. The method of claim 1 wherein said adhesive compound is selected from the group consisting of polyimides, epoxy resins and phenolic resins.

7. The method of claim 1 wherein said molding compound contains filler compounds.

8. The method of claim 7 wherein said filler compounds are selected from the group consisting of silica, titanium dioxide, metal titanates, alumina, magnesia, boron nitride, silicon carbide, aluminum nitride, ground quartz, microglass and polyaramides.

9. The method of claim 1 further including the step of:
    forming relief means in said mold cavity for receiving and positioning said flexible circuit.

10. The method of claim 9 wherein said relief means has a depth and dimensions equal to the dimensions of said flexible circuit.

11. The method of claim 10 further including the step of:
    forming an opening in said relief means; and
    pulling a vacuum through said opening to hold said flexible circuit in said relief means.

12. A method of making a three dimensional article having a circuit pattern embedded on a surface of the article, comprising:
    forming a copper circuit pattern on a flexible substrate to define a flexible circuit;
    treating the copper to enhance adhesion to the copper;
    placing said flexible circuit into a mold cavity with the circuit pattern facing toward the interior of the mold cavity;
    introducing a molding compound into said mold cavity, to fill the cavity wherein said molding compound is forced against said flexible circuit;
    curing said molding compound to define a three dimensional article;
    removing said molded object from the mold cavity with said flexible circuit being embedded on the surface of said article; and
    removing said flexible substrate from said molded article while leaving said circuit pattern embedded on the surface of the article.

13. A method of making a three dimensional article having a circuit pattern embedded on a surface of the article, comprising:
    forming a copper circuit pattern on a flexible substrate to define a flexible circuit;
    placing said flexible circuit into a mold cavity with the circuit pattern facing toward the interior of the mold cavity;
    pulling a vacuum through said mold cavity wherein said vacuum holds said flexible circuit in a preselected position;
    introducing a molding compound into said mold cavity, to fill the cavity wherein said molding compound is forced against said flexible circuit;
    curing said molding compound to define a three dimensional article;
    removing said molded object from the mold cavity with said flexible circuit being embedded on the surface of said article; and
    removing said flexible substrate from said molded article while leaving said circuit pattern embedded on the surface of the article.

14. A method of making a three dimensional article having a circuit pattern embedded on a surface of the article, comprising:
    forming a metallic circuit pattern on a flexible substrate to define a flexible circuit;
    placing said flexible circuit into a mold cavity with the circuit pattern facing toward the interior of the mold cavity;
    introducing a molding compound into said mold cavity, to fill the cavity wherein said molding compound is forced against said flexible circuit;
    curing said molding compound to define a three dimensional article;

removing said molded object from the mold cavity with said flexible circuit being embedded on the surface of said article; and chemically rinsing said flexible substrate to remove said flexible substrate from said molded object while leaving said circuit pattern embedded on the surface of the article.

15. A method of making a three dimensional article having a circuit pattern imbedded on a surface of the article comprising:

forming a copper circuit pattern on a flexible polyimide substrate to define a flexible circuit, wherein the circuit pattern is bonded to the substrate by a LARC polyimide adhesive layer between the circuit pattern and the substrate;

placing said flexible circuit into a mold cavity with the circuit pattern facing toward the interior of the mold cavity;

introducing a vinyl butadiene molding compound into said mold cavity, to fill the cavity wherein said molding compound is forced against said flexible circuit;

curing said molding compound to define a three dimensional article;

removing said molded object from the mold cavity with said flexible circuit being embedded on the surface of said molded article; and removing said flexible substrate from said molded object while leaving said circuit pattern embedded on the surface of the article.

16. The method of claim 15 including:

removing said flexible substrate by chemically attacking said LARC polyimide adhesive layer with hot alkali solution.

17. A method of making a three dimensional article comprising:

forming a copper circuit pattern on a flexible circuit;

placing said flexible circuit into a mold cavity with the circuit pattern facing toward the interior of the mold cavity;

introducing a molding compound into said mold cavity to fill the cavity wherein said molding compound is forced against said flexible circuit;

curing said molding compound to define a three dimensional core;

removing said molded core from side mold cavity with said flexible circuit being embedded on said molded core;

removing said flexible substrate from said molded core while leaving said circuit pattern embedded on the surface of the dimensional molded core; and molding at least one additional layer of molding compound over the core to define a first covering layer.

* * * * *